(12) United States Patent
Takahashi

(10) Patent No.: US 10,475,785 B2
(45) Date of Patent: Nov. 12, 2019

(54) SEMICONDUCTOR DEVICE

(71) Applicant: Kabushiki Kaisha Toshiba, Minato-ku, Tokyo (JP)

(72) Inventor: Keita Takahashi, Yokohama Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 176 days.

(21) Appl. No.: 15/042,473

(22) Filed: Feb. 12, 2016

(65) Prior Publication Data
US 2017/0069624 A1 Mar. 9, 2017

Related U.S. Application Data

(60) Provisional application No. 62/215,095, filed on Sep. 7, 2015.

(51) Int. Cl.
*H01L 29/78* (2006.01)
*H01L 27/06* (2006.01)
*H01L 29/06* (2006.01)

(52) U.S. Cl.
CPC ...... *H01L 27/0635* (2013.01); *H01L 27/0629* (2013.01); *H01L 29/0646* (2013.01); *H01L 29/782* (2013.01); *H01L 29/7835* (2013.01); *H01L 29/0653* (2013.01)

(58) Field of Classification Search
CPC ............. H01L 27/0635; H01L 29/0646; H01L 29/0649; H01L 29/7806; H01L 29/782; H01L 29/7816; H01L 29/7817; H01L 29/0653; H01L 29/66143; H01L 29/66212; H01L 29/872; H01L 29/8725; H01L 29/0642; H01L 29/2649; H01L 2924/12032

See application file for complete search history.

(56) References Cited

U.S. PATENT DOCUMENTS

| 4,795,722 A * | 1/1989 | Welch ............... H01L 21/32053 148/DIG. 11 |
| 6,870,223 B2 | 3/2005 | Kumagai et al. |
| 9,196,723 B1 * | 11/2015 | Chen .................... H01L 29/782 |
| 2009/0020826 A1 * | 1/2009 | Huang .................. H01L 29/782 257/371 |

(Continued)

FOREIGN PATENT DOCUMENTS

| JP | 2007-215389 A | 8/2007 |
| JP | 2010-081043 A | 4/2010 |
| JP | 2015-056634 A | 3/2015 |

*Primary Examiner* — Monica D Harrison
*Assistant Examiner* — John Lin
(74) *Attorney, Agent, or Firm* — White & Case LLP

(57) ABSTRACT

According to one embodiment, the insulating film is provided between the anode region and the cathode region in the surface of the second semiconductor region. The third semiconductor region is provided inside the second semiconductor region. The third semiconductor region covers a corner of the insulating film on the anode region side. The first electrode contacts the anode region and the third semiconductor region. The second electrode contacts the cathode region. The third electrode is provided on the insulating film and positioned on a p-n junction between the second semiconductor region and the third semiconductor region.

13 Claims, 3 Drawing Sheets

(56) References Cited

U.S. PATENT DOCUMENTS

| | | | |
|---|---|---|---|
| 2009/0256197 A1* | 10/2009 | Nakazawa | H01L 29/0878 257/334 |
| 2013/0075808 A1* | 3/2013 | Calafut | H01L 27/06 257/328 |

* cited by examiner

SEMICONDUCTOR DEVICE

CROSS-REFERENCE TO RELATED APPLICATION

This application is based upon and claims the benefit of priority from U.S. Provisional Patent Application 62/215,095, filed on Sep. 7, 2015; the entire contents of which are incorporated herein by reference.

FIELD

Embodiments described herein relate generally to a semiconductor device.

BACKGROUND

In a switching element connected to, for example, an inductive load such as a coil or the like, a current flows in a body diode (a parasitic diode) of the switching element when the gate is OFF due to energy stored in the inductive load. This may cause the operation of a thyristor that occurs parasitically between the switching element, a substrate in which the switching element is formed, and other elements formed in the same substrate. And the current may continue to be amplified and may cause thermal destruction of the element to occur.

DETAILED DESCRIPTION

Figure 1:
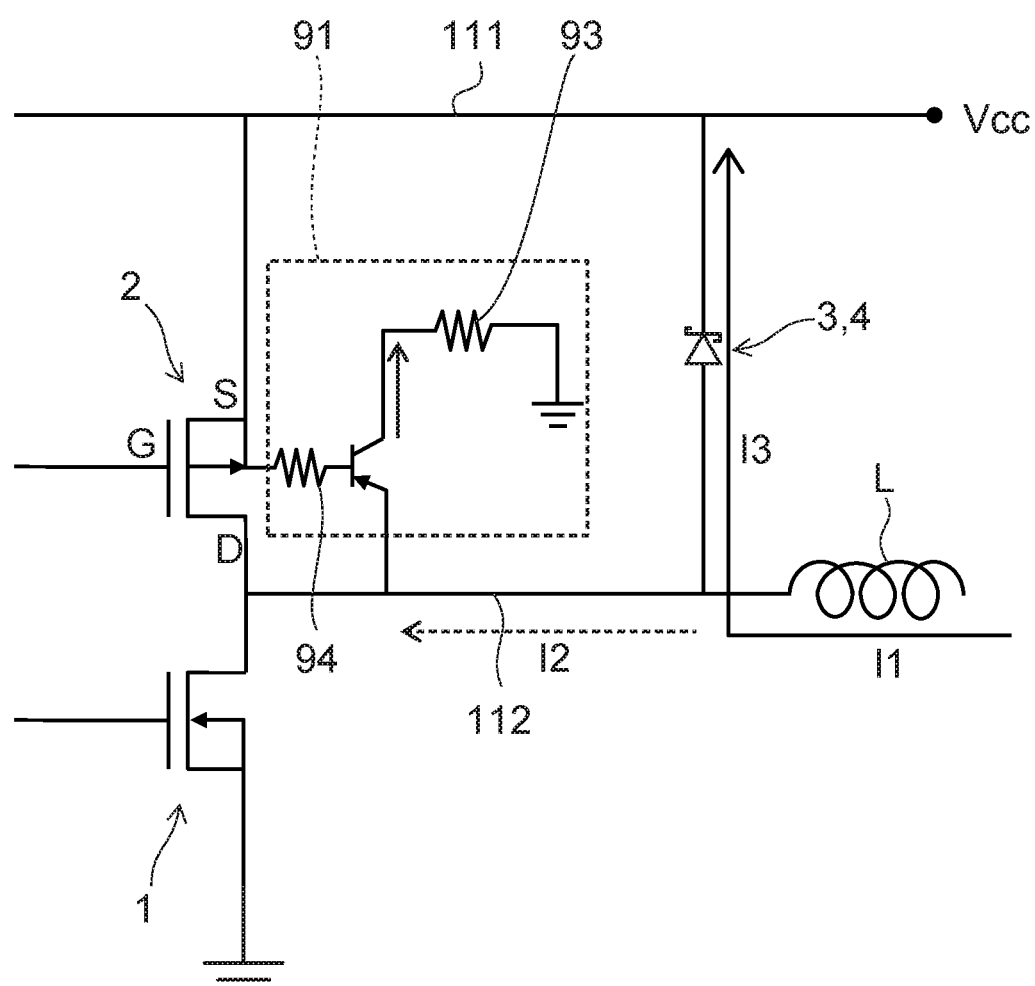
FIG. 1 is a circuit diagram of a semiconductor device of an embodiment.

According to one embodiment, a semiconductor device includes a first semiconductor region, a second semiconductor region of a first conductivity type, an anode region of the first conductivity type, a cathode region of the first conductivity type, an insulating film, a third semiconductor region of a second conductivity type, a first electrode, a second electrode, and a third electrode. The second semiconductor region is provided in a surface of the first semiconductor region. The anode region is provided in a surface of the second semiconductor region. The cathode region is provided in the surface of the second semiconductor region. A first conductivity-type impurity concentration is higher in the cathode region than in the anode region. The insulating film is provided between the anode region and the cathode region in the surface of the second semiconductor region. The third semiconductor region is provided inside the second semiconductor region. The third semiconductor region covers a corner of the insulating film on the anode region side. The first electrode contacts the anode region and the third semiconductor region. The second electrode contacts the cathode region. The third electrode is provided on the insulating film and positioned on a p-n junction between the second semiconductor region and the third semiconductor region.

Embodiments will now be described with reference to the drawings. The same components in the drawings are marked with the same reference numerals.

Although the first conductivity type is described as an n-type and the second conductivity type is described as a p-type in the embodiments recited below, the embodiments are implementable also in the case where the first conductivity type is the p-type and the second conductivity type is the n-type.

The semiconductor device of the embodiment is used in, for example, an H-bridge circuit, an inverter circuit, a DC-DC converter circuit, etc., that outputs a large current.

FIG. 1 is a circuit diagram of a circuit including the semiconductor device of the embodiment.

A high-side switching element 2 and a low-side switching element 1 are connected in series between a grounding terminal and a power supply line 111 used as a first line. The power supply line 111 is connected to a power supply and supplied with a power supply voltage (an input voltage) Vcc.

The high-side switching element 2 is, for example, a p-channel double diffused metal oxide semiconductor field effect transistor (DMOS). A source terminal (a source electrode) of the high-side switching element 2 is connected to the power supply line 111; and a drain terminal (a drain electrode) of the high-side switching element 2 is connected to an output line 112 used as a second line.

The low-side switching element 1 is, for example, an n-channel MOSFET. A drain terminal (a drain electrode) of the low-side switching element 1 is connected to the drain terminal of the high-side switching element 2 and the output line 112. A source terminal (a source electrode) of the low-side switching element 1 is connected to the grounding terminal.

The high-side switching element 2 and a Schottky barrier diode 3 (or 4) are connected in parallel between the power supply line 111 and the output line 112.

An anode terminal (an anode electrode) of the Schottky barrier diode 3 (or 4) is connected to the output line 112; and a cathode terminal (a cathode electrode) of the Schottky barrier diode 3 (or 4) is connected to the power supply line 111.

For example, a coil L is connected to the output line 112 as a load. Accordingly, the high-side switching element 2 and the Schottky barrier diode 3 (or 4) are connected in parallel between the power supply Vcc and the coil L.

The high-side switching element 2, the low-side switching element 1, a control circuit that drives these switching elements, and the Schottky barrier diode 3 (or 4) are integrated in one semiconductor chip.

Figure 2:
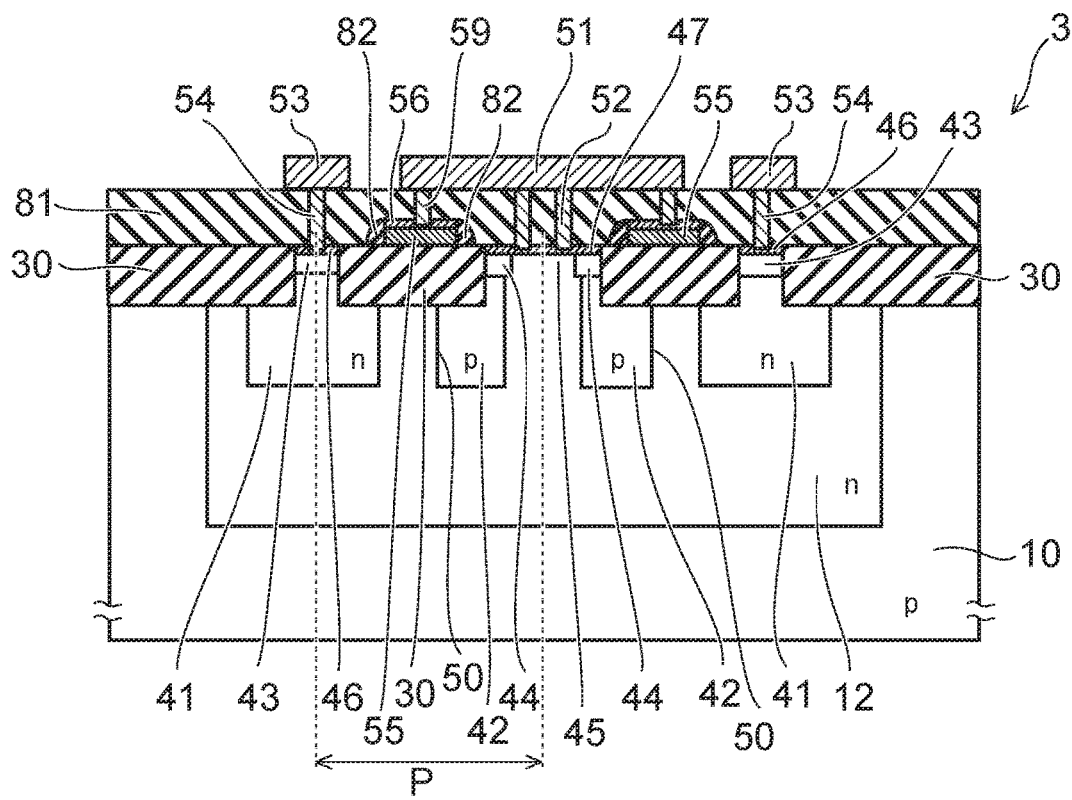
FIG. 2 is a schematic cross-sectional view of a Schottky barrier diode of the embodiment.

FIG. 2 is a schematic cross-sectional view of the Schottky barrier diode 3 of the embodiment.

Figure 3:
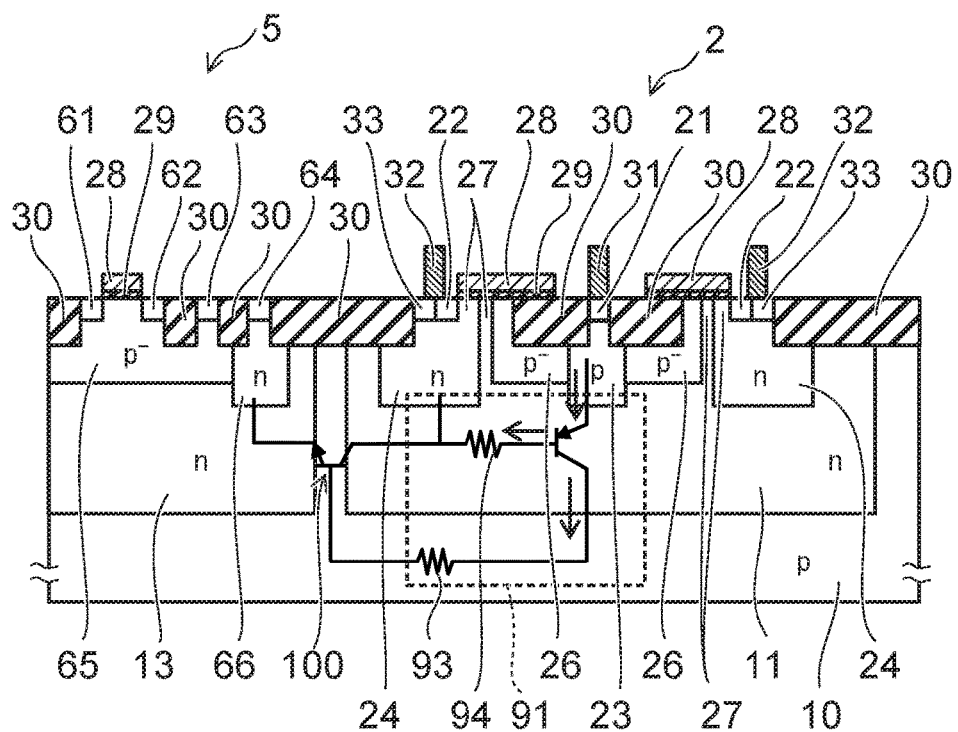
FIG. 3 is a schematic cross-sectional view of the semiconductor device of the embodiment.

FIG. 3 is a schematic cross-sectional view of the high-side switching element 2 of the embodiment and another element (e.g., a logic element 5).

The semiconductor device of the embodiment has a structure in which the Schottky barrier diode 3, the high-side switching element 2, and the logic element 5 are provided together on the same substrate 10.

The substrate (or the semiconductor region) 10 is a p-type semiconductor substrate and is, for example, a p-type silicon substrate. Also, the semiconductor region that is described below includes mainly silicon. Or, the substrate 10 and the semiconductor are not limited to silicon and may be, for example, silicon carbide, gallium nitride, etc.

For example, an analog integrated circuit that includes the logic element 5 is formed in the central region of the semiconductor device having a chip configuration. For example, the high-side switching element 2 and the Schottky barrier diode 3 (or 4) are formed in the chip peripheral region. For example, the high-side switching element 2 is formed in a region between the logic element 5 and the Schottky barrier diode 3 (or 4) in a direction along the front surface of the substrate 10.

As shown in FIG. 2 and FIG. 3, for example, an insulating separation unit (an insulating film) 30 that has a Shallow Trench Isolation (STI) structure is provided between the components that need to be insulatively separated in the front surface of the substrate 10.

The logic element 5 and the high-side switching element 2 are insulatively separated by the insulating separation unit 30 formed between the logic element 5 and the high-side switching element 2. The high-side switching element 2 and the Schottky barrier diode 3 (or 4) are insulatively separated by the insulating separation unit 30 formed between the high-side switching element 2 and the Schottky barrier diode 3 (or 4).

First, the high-side switching element 2 will be described with reference to FIG. 3.

The high-side switching element 2 has a DMOS structure in which the channel is formed by double diffusion and the difference between the lateral diffusion of the diffusion regions is utilized as the effective channel length.

The high-side switching element 2 includes an n-type semiconductor region 11 formed in the front surface of the substrate 10. The n-type semiconductor region 11 and the p-type substrate 10 have a p-n junction; and the n-type semiconductor region 11 is electrically isolated from the substrate 10. For example, the substrate 10 is grounded; and the n-type semiconductor region 11 is connected to the source terminal of the high-side switching element 2 via an n-type semiconductor region 24 and an $n^+$-type semiconductor region 33.

A pair of p-type semiconductor regions 26 is formed in the front surface of the n-type semiconductor region 11; and a p-type semiconductor region 23 is formed between the p-type semiconductor regions 26. The p-type impurity concentration of the p-type semiconductor region 23 is higher than the p-type impurity concentration of the p-type semiconductor region 26.

A $p^+$-type drain region 21 is formed in the front surface of the p-type semiconductor region 23. The p-type impurity concentration of the $p^+$-type drain region 21 is higher than the p-type impurity concentration of the p-type semiconductor region 23.

The two side surfaces of the $p^+$-type drain region 21 contact the insulating separation unit 30 formed in the front surface of the p-type semiconductor region 26.

A pair of n-type semiconductor regions 24 is formed in the front surface of the n-type semiconductor region 11 to be separated respectively from the pair of p-type semiconductor regions 26.

A $p^+$-type source region 22 is formed in the front surface of each of the n-type semiconductor regions 24.

Also, the $n^+$-type semiconductor region 33 is formed in the front surface of each of the n-type semiconductor regions 24 to be adjacent to the $p^+$-type source region 22. The n-type impurity concentration of the $n^+$-type semiconductor region 33 is higher than the n-type impurity concentration of the n-type semiconductor region 24.

The one side surface of the $n^+$-type semiconductor region 33 contacts the $p^+$-type source region 22; and another side surface contacts the insulating separation unit 30.

The side surface of the $p^+$-type source region 22 on the $p^+$-type drain region 21 side is inside the n-type semiconductor region 24. The n-type semiconductor region 11 is formed between the n-type semiconductor region 24 and the p-type semiconductor region 26.

The front surface region of the n-type semiconductor region 24 and the front surface region of the n-type semiconductor region 11 that are formed between the $p^+$-type source region 22 and the p-type semiconductor region 26 function as a channel region 27.

A gate insulator film 29 is provided on the channel region 27 and on the front surface of the p-type semiconductor region 26 adjacent to the channel region 27. A gate electrode 28 is provided on the gate insulator film 29.

A drain electrode 31 is provided as a fourth electrode on the $p^+$-type drain region 21. The $p^+$-type drain region 21 is electrically connected to and has an ohmic contact with the drain electrode 31 directly or via a metal silicide region.

A source electrode 32 is provided as a fifth electrode on the $p^+$-type source region 22. The $p^+$-type source region 22 is electrically connected to and has an ohmic contact with the source electrode 32 directly or via a metal silicide region.

The source electrode 32 is provided also on the $n^+$-type semiconductor region 33 and contacts the $n^+$-type semiconductor region 33.

For example, the gate electrode 28 and the semiconductor regions of the high-side switching element 2 are formed in planar patterns having stripe configurations.

In the high-side switching element 2 described above, when a desired gate voltage is applied to the gate electrode 28, an inversion layer (a p-channel) is formed in the channel region 27; and a current flows between the source electrode 32 and the drain electrode 31 via the $p^+$-type source region 22, the channel region 27, the p-type semiconductor region 26, the p-type semiconductor region 23, and the $p^+$-type drain region 21. The current flows in the p-type semiconductor region 26 and the p-type semiconductor region 23 to flow around through the region under the insulating separation unit 30.

The insulating separation unit 30 that is formed on the drain side increases the breakdown voltage of the high-side switching element 2. Also, the p-type semiconductor region 26 that has the p-type impurity concentration that is lower than that of the $p^+$-type drain region 21 is depleted when the gate is OFF and increases the breakdown voltage.

Also, a breakdown voltage decrease due to the impurity concentration changing abruptly from the p-type semiconductor region 26 to the $p^+$-type drain region 21 can be suppressed by providing the p-type semiconductor region 23 between the p-type semiconductor region 26 and the $p^+$-type drain region 21, where the p-type impurity concentration of the p-type semiconductor region 23 is between the p-type impurity concentration of the p-type semiconductor region 26 and the p-type impurity concentration of the $p^+$-type drain region 21.

The logic element 5 will now be described.

The logic element 5 has, for example, a CMOS structure. A portion of the logic element 5 (e.g., an n-channel MOSFET) is shown in FIG. 3.

The logic element 5 includes an n-type semiconductor region 13 formed in the front surface of the substrate 10. The n-type semiconductor region 13 and the p-type substrate 10 have a p-n junction; and the n-type semiconductor region 13 is electrically isolated from the substrate 10.

A p-type semiconductor region 65 is formed in the front surface of the n-type semiconductor region 13. An $n^+$-type semiconductor region 61 and an $n^+$-type semiconductor region 62 are formed in the front surface of the p-type semiconductor region 65. One of the $n^+$-type semiconductor region 61 or the n⁺-type semiconductor region 62 functions as a drain region; and the other functions as a source region.

The gate electrode 28 is provided, with the insulator film 29 interposed, on a channel region (the front surface region of the p-type semiconductor region 65) between the n⁺-type semiconductor region 61 and the n⁺-type semiconductor region 62.

Also, an n-type semiconductor region 66 is formed in the front surface of the n-type semiconductor region 13 to be adjacent to the p-type semiconductor region 65. An n⁺-type semiconductor region 64 is formed in the front surface of the n-type semiconductor region 66.

The n-type impurity concentration of the n⁺-type semiconductor region 64 is higher than the n-type impurity concentration of the n-type semiconductor region 66.

Also, a p⁺-type semiconductor region 63 is formed in the front surface of the p-type semiconductor region 65. The insulating separation unit 30 is formed between the p⁺-type semiconductor region 63 and the n⁺-type semiconductor region 62. The insulating separation unit 30 is formed between the p⁺-type semiconductor region 63 and the n⁺-type semiconductor region 64.

The Schottky barrier diode 3 will now be described with reference to FIG. 2.

The Schottky barrier diode 3 includes an n-type semiconductor region 12 formed in the front surface of the substrate 10. The n-type semiconductor region 12 and the p-type substrate 10 have a p-n junction; and the n-type semiconductor region 12 is electrically isolated from the substrate 10. For example, the substrate 10 is grounded; and the n-type semiconductor region 12 is connected to a cathode electrode 53 of the Schottky barrier diode 3 via an n-type semiconductor region 41 and an n⁺-type cathode region 43.

Multiple n-type semiconductor regions 41 and multiple p-type semiconductor regions 42 are formed in the front surface of the n-type semiconductor region 12. For example, the n-type semiconductor regions 41 and the p-type semiconductor regions 42 are formed in planar patterns having stripe configurations. The n-type semiconductor regions 41 and the p-type semiconductor regions 42 are separated respectively from each other in a direction along the front surface of the substrate 10.

The n⁺-type cathode region 43 is formed in the front surface of the n-type semiconductor region 41. The n-type impurity concentration of the n⁺-type cathode region 43 is higher than the n-type impurity concentration of the n-type semiconductor region 41.

A p⁺-type semiconductor region 44 is formed in the front surface of the p-type semiconductor region 42. The p-type impurity concentration of the p⁺-type semiconductor region 44 is higher than the p-type impurity concentration of the p-type semiconductor region 42.

A pair of p-type semiconductor regions 42 is formed between a pair of n-type semiconductor regions 41. The n-type semiconductor region 12 is formed between the pair of p-type semiconductor regions 42; and an n-type anode region 45 is formed in the front surface of the n-type semiconductor region 12. The anode region 45 is formed between the pair of p⁺-type semiconductor regions 44.

The n-type impurity concentrations of the anode region 45 and the n-type semiconductor region 12 are lower than the n-type impurity concentration of the n-type semiconductor region 41.

A metal silicide region 47 is formed in the front surface of the anode region 45; an insulating layer 81 is formed on the metal silicide region 47; and an anode electrode 51 is provided as a first electrode on the insulating layer 81. The insulating layer 81 is provided on the front surface of the substrate 10.

The anode electrode 51 and the metal silicide region 47 are connected via a contact 52 piercing the insulating layer 81. The anode electrode 51 and the contact 52 are formed from metal materials. The contact 52 has a Schottky contact with the anode region 45 via the metal silicide region 47.

The anode region 45 has a Schottky contact with the anode electrode 51 via the metal silicide region 47 and the contact 52.

A metal silicide region 46 is formed in the front surface of the cathode region 43; the insulating layer 81 is formed on the metal silicide region 46; and the cathode electrode 53 is provided as a second electrode on the insulating layer 81.

The cathode electrode 53 and the metal silicide region 46 are connected via a contact 54 piercing the insulating layer 81. The cathode electrode 53 and the contact 54 are formed from metal materials. The contact 54 has an ohmic contact with the cathode region 43 via the metal silicide region 46.

The cathode region 43 has an ohmic connection with the cathode electrode 53 via the metal silicide region 46 and the contact 54.

The cathode region 43 is provided between the insulating separation unit 30; and the side surfaces of the cathode region 43 are adjacent to the insulating separation unit 30.

The insulating separation unit 30 is provided between the cathode region 43 and the p⁺-type semiconductor region 44. The p⁺-type semiconductor region 44 is formed between the insulating separation unit 30 and the anode region 45.

One corner on the bottom side of the insulating separation unit 30 between the cathode region 43 and the p⁺-type semiconductor region 44 is positioned inside the n-type semiconductor region 41; and the other corner is positioned inside the p-type semiconductor region 42.

The n-type semiconductor region 41 covers the corner of the insulating separation unit 30 on the cathode region 43 side; and the p-type semiconductor region 42 covers the corner of the insulating separation unit 30 on the anode region 45 side.

A third electrode 55 is provided on the insulating separation unit 30 between the cathode region 43 and the p⁺-type semiconductor region 44. The third electrode 55 is positioned on a p-n junction 50 between the p-type semiconductor region 42 and the n-type semiconductor region 12 under the insulating separation unit 30.

The third electrode 55 is, for example, a polycrystalline silicon film; and a metal silicide region 56 is formed in the front surface of the third electrode 55.

The insulating layer 81 is formed on the metal silicide region 56; and a portion of the anode electrode 51 is provided on the insulating layer 81. The anode electrode 51 extends from a region on the anode region 45 to a region on the third electrode 55.

The anode electrode 51 and the third electrode 55 are connected via the metal silicide region 56 and a contact 59 piercing the insulating layer 81. Accordingly, the third electrode 55 is shorted to the anode electrode 51; and the potential of the anode electrode 51 is applied to the third electrode 55.

The metal silicide region 47 that is formed in the front surface of the anode region 45 also is formed in the front surface of the p⁺-type semiconductor region 44 adjacent to the anode region 45. The p⁺-type semiconductor region 44 is connected to the anode electrode 51 via the metal silicide region 47 and the contact 52.

Accordingly, the potential of the anode electrode 51 is applied to the p-type semiconductor region 42 via the contact 52, the metal silicide region 47, and the p$^+$-type semiconductor region 44.

For example, the semiconductor regions of the Schottky barrier diode 3, the high-side switching element 2, and the logic element 5 described above are formed by ion implantation and subsequent annealing.

The n-type semiconductor region 12 of the Schottky barrier diode 3 shown in FIG. 2, the n-type semiconductor region 11 of the high-side switching element 2 shown in FIG. 3, and the n-type semiconductor region 13 of the logic element 5 shown in FIG. 3 are formed by simultaneous processing and have substantially the same depth.

The n-type semiconductor region 41 of the Schottky barrier diode 3, the n-type semiconductor region 24 of the high-side switching element 2, and the n-type semiconductor region 66 of the logic element 5 are formed by simultaneous processing.

The p-type semiconductor region 42 of the Schottky barrier diode 3 and the p-type semiconductor region 23 of the high-side switching element 2 are formed by simultaneous processing.

The p-type semiconductor region 26 of the high-side switching element 2 and the p-type semiconductor region 65 of the logic element 5 are formed by simultaneous processing.

The n$^+$-type cathode region 43 of the Schottky barrier diode 3, the n$^+$-type semiconductor region 33 of the high-side switching element 2, and the n$^+$-type semiconductor regions 61, 62, and 64 of the logic element 5 are formed by simultaneous processing.

The p$^+$-type semiconductor region 44 of the Schottky barrier diode 3, the p$^+$-type drain region 21 and the p$^+$-type source region 22 of the high-side switching element 2, and the p$^+$-type semiconductor region 63 of the logic element 5 are formed by simultaneous processing.

The third electrode 55 of the Schottky barrier diode 3, the gate electrode 28 of the high-side switching element 2, and the gate electrode 28 of the logic element 5 are formed of the same material (e.g., polycrystalline silicon) by simultaneous processing.

Also, a sidewall insulating film 82 is formed on the side walls of the third electrode 55 of the Schottky barrier diode 3. Although not shown, sidewall insulating films are formed also on the side walls of the gate electrode 28 of the high-side switching element 2 and the side walls of the gate electrode 28 of the logic element 5; and the sidewall insulating films are formed by simultaneous processing with the sidewall insulating film 82 of the Schottky barrier diode 3.

As shown in FIG. 2 and FIG. 3, the Schottky barrier diode 3, the high-side switching element 2, and the logic element 5 are formed respectively in the front surfaces of the n-type semiconductor region 12, the n-type semiconductor region 11, and the n-type semiconductor region 13 that are electrically isolated from the substrate 10. The Schottky barrier diode 3, the high-side switching element 2, and the logic element 5 are not electrically connected to each other via the substrate 10. Currents do not flow easily into the substrate 10 from the Schottky barrier diode 3, the high-side switching element 2, and the logic element 5.

The n-type semiconductor region 11 of the high-side switching element 2 and the n-type semiconductor region 12 of the Schottky barrier diode 3 are separated from each other inside the p-type substrate 10. A p-type semiconductor region (a portion of the substrate 10) that is of the opposite conductivity type of the n-type semiconductor region 11 and the n-type semiconductor region 12 is formed between the n-type semiconductor region 11 and the n-type semiconductor region 12. Therefore, carrier movement between the n-type semiconductor region 11 and the n-type semiconductor region 12 is suppressed; and misoperations of the high-side switching element 2 and the Schottky barrier diode 3 do not occur easily.

In the circuit shown in FIG. 1, an average output voltage that is lower than the input voltage Vcc is output to the output line 112 by switching the high-side switching element 2 and the low-side switching element 1 alternately ON and OFF.

When the high-side switching element 2 is ON and the low-side switching element 1 is OFF, a current flows in the coil L from the power supply via the high-side switching element 2. At this time, charge is stored in the coil L.

When the low-side switching element 1 is ON and the high-side switching element 2 is OFF, a current flows in the grounding terminal from an output terminal via the coil L and the low-side switching element 1. At this time as well, the current flows and the charge is stored in the coil L.

When the high-side switching element 2 and the low-side switching element 1 are switched ON simultaneously, a shoot-through current flows in the grounding terminal from the power supply line 111 via the switching elements 2 and 1. To avoid this, an interval (dead time) when the switching elements 2 and 1 both are OFF is set when setting the duty of ON and OFF of the switching elements 2 and 1.

In the dead time, the gate of the high-side switching element 2 is OFF; but the current continues to flow in the coil L due to the stored charge. In other words, the drain-side potential of the high-side switching element 2 becomes higher than the source-side potential of the high-side switching element 2; a forward voltage is applied to the body diode (the p-n junction between the p-type semiconductor region 23 and the n-type semiconductor region 11 in FIG. 3) that is built into the high-side switching element 2; and a recovery current flows in the body diode. At this time, there are cases where a parasitic p-n-p transistor 91 schematically illustrated by the broken lines in FIG. 1 and FIG. 3 operates.

In the high-side switching element 2, a higher breakdown voltage is realized by a depletion layer spreading from the p-n junction between the n-type semiconductor region 11 and the p-type substrate 10. Therefore, the n-type impurity concentration of the n-type semiconductor region 11 and the p-type impurity concentration of the p-type substrate 10 are suppressed to be low.

Because the n-type impurity concentration of the n-type semiconductor region 11 is low, the recombination current of the base of the parasitic p-n-p transistor 91 decreases; a base resistance 94 becomes high; and a current flows easily in the substrate 10.

Further, because a parasitic resistance 93 of the substrate 10 also is high, the potential of the substrate 10 increases easily; the base potential of an n-p-n transistor 100 occurring parasitically in the high-side switching element 2, the substrate 10, and the logic element 5 increases; and the parasitic n-p-n transistor 100 operates easily.

When the parasitic n-p-n transistor 100 operates, the parasitic p-n-p transistor 91 does not return to OFF because the base current of the parasitic p-n-p transistor 91 continues to be supplied; and the parasitic n-p-n transistor 100 also does not return to OFF because the parasitic p-n-p transistor 91 continues to operate. In other words, latchup occurs due to the operation of the parasitic thyristor; a large current flows into the logic element 5; and there is a risk that breakdown of the logic element 5 may occur undesirably.

However, according to the embodiment, the Schottky barrier diode 3 is connected in parallel with the high-side switching element 2 between the power supply and the coil L.

Accordingly, in the dead time, a coil current I1 is dispersed into a current I2 that flows in the high-side switching element 2 and a current I3 that flows in the Schottky barrier diode 3. This can reduce the current flowing in the substrate 10 via the parasitic p-n-p transistor 91 of the high-side switching element 2.

The forward voltage of the Schottky barrier diode 3 is lower than the forward voltage of the body diode (the p-n diode) of the high-side switching element 2. For example, for a silicon material, the forward voltage of the Schottky barrier diode is about 0.35 V, while the forward voltage of the p-n diode is 0.6 V or more.

Therefore, the coil current I1 flows more easily in the Schottky barrier diode 3 than in the body diode of the high-side switching element 2; and the current flowing in the substrate 10 can be suppressed by the parasitic p-n-p transistor 91.

By the current flowing in the substrate 10 being suppressed, the potential increase of the substrate 10 which has a high resistance is suppressed; and the element breakdown due to the latchup due to the parasitic thyristor operation can be prevented.

Also, according to the Schottky barrier diode 3 of the embodiment shown in FIG. 2, the off-leakage current when a reverse voltage is applied between the anode and cathode is suppressed by the insulating separation unit 30 provided between the cathode region 43 and the anode region 45.

The p-type semiconductor region 42 that is formed to cover the corner of the insulating separation unit 30 on the anode side suppresses the current concentration at the corner vicinity of the insulating separation unit 30.

By forming the p-type semiconductor region 42, the p-n junction 50 is formed in the region between the anode region 45 and the cathode region 43.

The third electrode 55 that is shorted to the anode electrode 51 is provided above the p-n junction 50. The third electrode 55 functions as a so-called field plate electrode and relaxes the electric field when the reverse voltage of the p-n junction 50 is applied. In other words, a potential difference between the anode electrode 51 and the cathode electrode 53 is applied in the p-n junction 50.

Such electric field relaxation due to the third electrode 55, the p-type semiconductor region 42, and the insulating separation unit 30 between the anode and cathode increases the breakdown voltage of the Schottky barrier diode 3.

Due to the increase of the breakdown voltage, it is possible to further reduce an element pitch P of the Schottky barrier diode 3. By reducing the element pitch P, the Schottky barrier diode 3 that has a low parasitic resistance and a high current capability is possible.

In the dead time described above, the decrease of the parasitic resistance of the Schottky barrier diode 3 increases the current capability of the Schottky barrier diode 3 and makes it possible for the coil current I1 to substantially not flow in the high-side switching element 2. This suppresses the current flowing in the substrate 10 via the parasitic p-n-p transistor 91 of the high-side switching element 2 and suppresses the parasitic thyristor operation of the semiconductor device.

Figure 4:
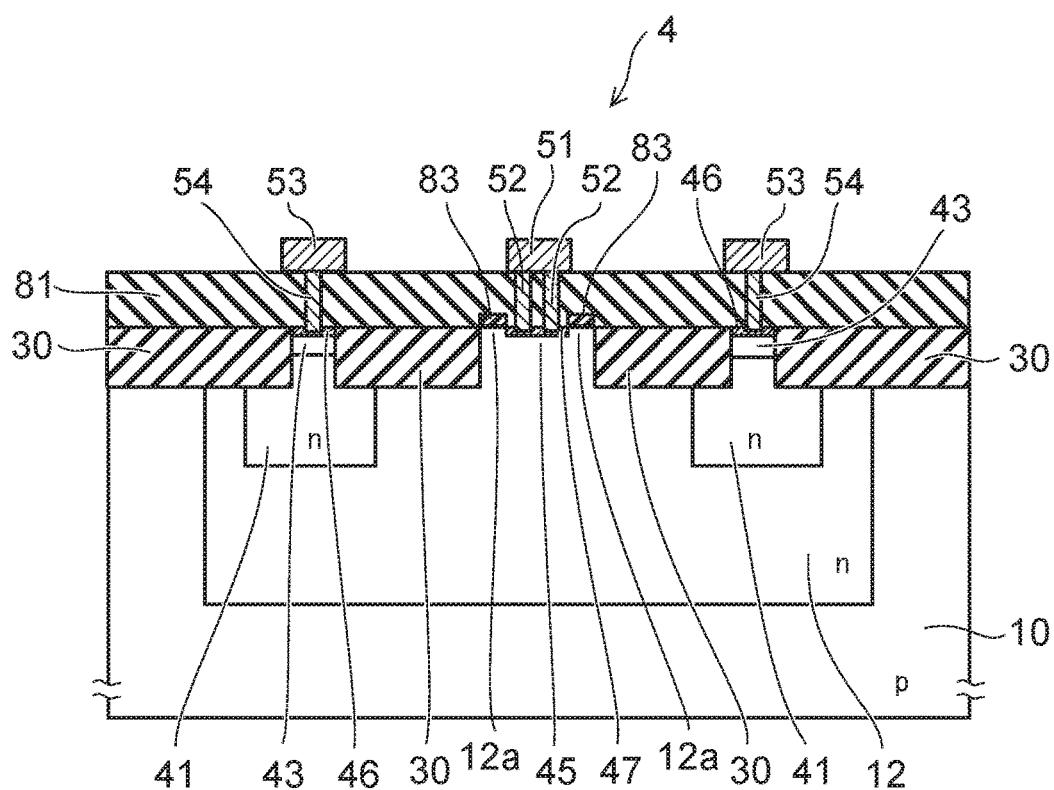
FIG. 4 is a schematic cross-sectional view of a Schottky barrier diode of another embodiment.

FIG. 4 is a schematic cross-sectional view of a Schottky barrier diode 4 of another embodiment. The same components as those of the Schottky barrier diode 3 described above and shown in FIG. 2 are marked with the same reference numerals, and a detailed description thereof is omitted.

In the Schottky barrier diode 4 shown in FIG. 4 as well, the insulating separation unit (the first insulating film) 30 is formed between the cathode region 43 and the anode region 45. However, the p-type semiconductor region is not formed at the corner of the insulating separation unit 30 on the anode side; and the third electrode is not formed on the insulating separation unit 30.

The anode region 45 has a Schottky contact with the anode electrode 51 via the metal silicide region 47 formed in the front surface of the anode region 45. The metal silicide region 47 is separated from the insulating separation unit 30 which is formed with the anode region 45 interposed.

An insulating film (a second insulating film) 83 is formed on a front surface 12a of the n-type semiconductor region 12 between the insulating separation unit 30 and the metal silicide region 47.

In the Schottky barrier diode 3 shown in FIG. 2, the current flows in the cathode region 43 from the anode region 45 to flow around under the p-type semiconductor region 42.

According to the Schottky barrier diode 4 shown in FIG. 4, because there is no p-type semiconductor region between the anode region 45 and the cathode region 43, the effective surface area where the current flows can be wide; and the current capability can be high.

Also, according to the Schottky barrier diode 4 shown in FIG. 4, the metal silicide region 47 of the anode region 45 is separated from the insulating separation unit 30 and does not contact the insulating separation unit 30. Therefore, the current concentration at the corner of the insulating separation unit 30 on the anode side can be relaxed; and effects similar to those of the Schottky barrier diode 3 of FIG. 2 in which the p-type semiconductor region 42 is formed at the corner of the insulating separation unit 30 are obtained.

Namely, in the Schottky barrier diode 4 of FIG. 4 as well, the off-leakage decreases; and the breakdown voltage of the Schottky barrier diode 4 increases. The increase of the breakdown voltage makes it possible to reduce the element pitch of the Schottky barrier diode 4; and the Schottky barrier diode 4 that has a low parasitic resistance and a high current capability is possible.

In the dead time described above, the decrease of the parasitic resistance of the Schottky barrier diode 4 increases the current capability of the Schottky barrier diode 4 and makes it possible for the coil current I1 to substantially not flow in the high-side switching element 2. This suppresses the current flowing in the substrate 10 via the parasitic p-n-p transistor 91 of the high-side switching element 2 and suppresses the parasitic thyristor operation of the semiconductor device.

The process of forming the metal silicide region 47 in the front surface of the anode region 45 includes a process of forming a metal film on the front surface of the anode region 45 and a process of causing the metal of the metal film to react with the silicon of the anode region 45 (the n-type semiconductor region 12) by annealing.

According to the embodiment shown in FIG. 4, the insulating film 83 is pre-formed on the front surface 12a of the n-type semiconductor region 12 adjacent to the insulating separation unit 30 prior to forming the metal film on the front surface of the n-type semiconductor region 12. The insulating film 83 is formed on the front surface 12a of the n-type semiconductor region 12 between the insulating separation unit 30 and on the front surface of the anode region 45 to be metal-silicided.

The metal film is not formed on the front surface 12a where the insulating film 83 is formed; and the metal silicide region 47 due to the reaction between the silicon and the metal is not formed in the front surface 12a.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor device, comprising:
   a first semiconductor region;
   a second semiconductor region of a first conductivity type provided inside the first semiconductor region;
   an anode region of the first conductivity type provided on the second semiconductor region;
   a cathode region of the first conductivity type provided on the second semiconductor region, a first conductivity-type impurity concentration being higher in the cathode region than in the anode region;
   an insulating film provided between the anode region and the cathode region and provided on the second semiconductor region, the insulating film having a corner on an anode region side, the corner being located deeper than an upper surface of the anode region;
   a third semiconductor region of a second conductivity type provided inside the second semiconductor region, the third semiconductor region covering the corner of the insulating film on the anode region side;
   a fifth semiconductor region of the second conductivity type provided on the third semiconductor region and being adjacent to the insulating film, a second conductivity-type impurity concentration of the fifth semiconductor region higher than a second conductivity-type impurity concentration of the third semiconductor region;
   a sixth semiconductor region of the first conductivity type provided on the second semiconductor region, the third semiconductor region and the sixth semiconductor region being separated from each other with stripe patterns;
   a first electrode contacting the anode region and the fifth semiconductor region;
   a second electrode contacting the cathode region; and
   a third electrode provided on the insulating film and positioned on a p-n junction between the second semiconductor region and the third semiconductor region.

2. The semiconductor device according to claim 1, wherein the semiconductor device is a Schottky barrier diode.

3. The semiconductor device according to claim 2, further comprising:
   a first line;
   a second line; and
   a switching element,
   the Schottky barrier diode and the switching element being connected in parallel between the first line and the second line,
   the switching element including
      a fourth semiconductor region provided on the first semiconductor region,
      a drain region provided on the fourth semiconductor region,
      a source region provided on the fourth semiconductor region,
      a channel region provided between the drain region and the source region on the fourth semiconductor region,
      a gate insulator film provided on the channel region,
      a gate electrode provided on the gate insulator film,
      a fourth electrode contacting the drain region, and
      a fifth electrode contacting the source region.

4. The semiconductor device according to claim 3, wherein the second semiconductor region and the fourth semiconductor region are at substantially the same depth.

5. The semiconductor device according to claim 3, wherein
   the second electrode and the fifth electrode are connected to the first line, and
   the first electrode and the fourth electrode are connected to the second line.

6. The semiconductor device according to claim 3, wherein a material of the third electrode is the same as a material of the gate electrode of the switching element.

7. The semiconductor device according to claim 3, wherein the first line is a power supply line, and the second line is an output line of the switching element.

8. The semiconductor device according to claim 3, wherein a forward voltage of the Schottky barrier diode is lower than a forward voltage of a body diode built into the switching element.

9. The semiconductor device according to claim 1, wherein the third electrode is shorted to the first electrode.

10. The semiconductor device according to claim 9, wherein
    the third electrode contains silicon, and
    the first electrode contacts the third electrode via a metal silicide region provided on the third electrode.

11. The semiconductor device according to claim 1, wherein the first electrode contacts the anode region and the fifth semiconductor region via a metal silicide region provided on the anode region and on the fifth semiconductor region.

12. The semiconductor device according to claim 1, wherein the second electrode contacts the cathode region via a metal silicide region provided on the cathode region.

13. The semiconductor device according to claim 1, wherein the anode region is provided between a plurality of the insulating film in a planar direction.

* * * * *